(12) United States Patent
Shinoda

(10) Patent No.: US 11,325,298 B2
(45) Date of Patent: May 10, 2022

(54) METHOD FOR PRODUCING RELIEF-PATTERN FORMATION, APPARATUS FOR PRODUCING THE SAME, AND SEAL

(71) Applicant: TOPPAN PRINTING CO., LTD., Tokyo (JP)

(72) Inventor: Koichi Shinoda, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 17/194,897

(22) Filed: Mar. 8, 2021

(65) Prior Publication Data

US 2021/0187821 A1 Jun. 24, 2021

Related U.S. Application Data

(60) Division of application No. 15/794,510, filed on Oct. 26, 2017, which is a continuation of application No. PCT/JP2016/063111, filed on Apr. 26, 2016.

(30) Foreign Application Priority Data

May 13, 2015 (JP) .............................. JP2015-098019

(51) Int. Cl.
*B29C 59/04* (2006.01)
*B32B 38/06* (2006.01)
(Continued)

(52) U.S. Cl.
CPC ...... *B29C 59/046* (2013.01); *B29D 11/00288* (2013.01); *B32B 37/003* (2013.01);
(Continued)

(58) Field of Classification Search
None
See application file for complete search history.

(56) References Cited

U.S. PATENT DOCUMENTS 3,542,630 A 11/1970 Pfiffner
2008/0317980 A1 12/2008 Yuba et al.
(Continued)

FOREIGN PATENT DOCUMENTS

EP 2 905 120 A1 8/2015
JP H11-300768 A 11/1999
(Continued)

OTHER PUBLICATIONS

International Search Report issued in International patent application No. PCT/JP2016/063111 dated Jul. 12, 2016.
(Continued)

*Primary Examiner* — Joshua D Zimmerman
(74) *Attorney, Agent, or Firm* — Foley & Lardner LLP

(57) ABSTRACT

A method and an apparatus for producing a relief-pattern forming, the method and apparatus being suitable for producing a film-like material, such as an embossed film, having a fine relief-structure pattern formed on a surface thereof so as to have a distinctive optical effect with higher quality, good productivity, and fewer defects. A transfer pattern printed layer having an inverted structure of a relief-structure pattern is formed on a second substrate by printing a transfer pattern onto the surface of a first substrate on which the relief-structure pattern is formed at a predetermined position by registration with the relief-structure pattern followed by drying, laminating with the second substrate, curing and peeling.

12 Claims, 8 Drawing Sheets

(51) Int. Cl.
   *B29D 11/00*  (2006.01)
   *B32B 37/00*  (2006.01)
   *B32B 38/10*  (2006.01)
   *B32B 39/00*  (2006.01)
   *B32B 38/00*  (2006.01)
   *B32B 38/16*  (2006.01)
   *B29C 35/08*  (2006.01)
   *B32B 37/20*  (2006.01)
   *G02B 5/18*  (2006.01)
   *H01L 21/027*  (2006.01)
   *H01L 51/00*  (2006.01)
   *G09F 19/12*  (2006.01)
   *G09F 3/02*  (2006.01)
   *G02B 1/12*  (2006.01)
   *H01L 51/52*  (2006.01)

(52) U.S. Cl.
   CPC ........ *B32B 37/025* (2013.01); *B32B 38/0008* (2013.01); *B32B 38/06* (2013.01); *B32B 38/10* (2013.01); *B32B 39/00* (2013.01); *G02B 1/12* (2013.01); *G09F 3/02* (2013.01); *G09F 19/12* (2013.01); *H01L 21/027* (2013.01); *H01L 51/003* (2013.01); *H01L 51/0097* (2013.01); *B29C 2035/0827* (2013.01); *B29D 11/00269* (2013.01); *B29D 11/00326* (2013.01); *B29D 11/00769* (2013.01); *B32B 37/203* (2013.01); *B32B 2038/168* (2013.01); *B32B 2310/0806* (2013.01); *B32B 2310/0831* (2013.01); *B32B 2310/14* (2013.01); *B32B 2451/00* (2013.01); *G02B 5/18* (2013.01); *H01L 51/5275* (2013.01); *Y02E 10/549* (2013.01)

(56) References Cited

U.S. PATENT DOCUMENTS

| | | |
|---|---|---|
| 2013/0065009 A1 | 3/2013 | Katsumoto et al. |
| 2015/0202829 A1 | 7/2015 | Toriyama et al. |

FOREIGN PATENT DOCUMENTS

| | | |
|---|---|---|
| JP | 2001-002853 A | 1/2001 |
| JP | 2009-000834 A | 1/2009 |
| JP | 2011-228674 A | 11/2011 |
| JP | 2012-201020 A | 10/2012 |
| JP | 5695804 B2 | 4/2015 |

OTHER PUBLICATIONS

Extended European Search Report dated Dec. 3, 2018, in corresponding application No. 16792556.9.

Office Action dated Jan. 14, 2020, for corresponding Japanese Patent Application No. 2017-517874.

METHOD FOR PRODUCING RELIEF-PATTERN FORMATION, APPARATUS FOR PRODUCING THE SAME, AND SEAL

CROSS-REFERENCE TO RELATED PATENT APPLICATIONS

The present application is a Divisional of U.S. patent application Ser. No. 15/794,510, filed on Oct. 26, 2017, which is a Bypass Continuation application filed under 35 U.S.C. § 111(a) claiming the benefit under 35 U.S.C. §§ 120 and 365(c) of International Application No. PCT/JP2016/063111, filed on Apr. 26, 2016, which is based upon and claims the benefit of priority of Japanese Patent Application No. 2015-098019, filed on May 13, 2015, the entireties of which are hereby incorporated by reference.

TECHNICAL FIELD

The present invention relates to a method for producing a relief-pattern body and an apparatus for producing the same. In particular, the present invention relates to a method of producing a relief-pattern forming and an apparatus for producing the same, suitable for production of a film-shaped substrate such as an embossed film having a fine relief pattern formed on the surface thereof so as to have distinctive optical effects with higher quality and higher productivity, with fewer or even no defects, and also relates to a seal.

BACKGROUND

In recent years, various films have been used in applications for optical devices such as displays and lighting devices. The films include embossed films with anti-reflective effects, plate-shaped lens films including lenticular lenses or fly eye lenses, light-diffusion films, brightness enhancement films, film-shaped optical waveguides and prism sheets. Films having a fine relief pattern formed on the surfaces thereof in a regular manner are known. Various a method for forming such a fine relief pattern in a regular manner are known (See PTLs 1, 2).

For example, PTL 1 discloses that resin is applied onto the surface of a plate cylinder on which a regular relief pattern is formed, and then is cured by being irradiated with ionizing radiation in a state where the resin applied to the plate cylinder is in contact with a continuously fed-film by sandwiching the film between the plate cylinder and an impression cylinder, followed by winding the film around a take-up roll to thereby peel off the film from the plate cylinder.

Further, PTL 2 discloses that the resin is applied onto the surface of a continuously-fed film in advance, and then is cured by being irradiated with ionizing radiation in a state where a relief pattern of a plate cylinder is transferred onto the resin by sandwiching the film between the plate cylinder having the regular relief pattern and an impression cylinder, followed by winding the film around a take-up roll to thereby peel off the film from the plate cylinder.

CITATION LIST

Patent Literature

PTL 1: JP H11-300768 A
PTL 2: JP 2001-62853 A

SUMMARY OF THE INVENTION

Technical Problem

In the above described process, air may enter into an area between a cured resin film on the surface of the film and the plate cylinder when a transfer speed of the film increases. This results in defects such that the film has air bubbles on the surface, and thus, the productivity cannot be increased. Further, in the process described in PTL 1, the plate cylinder includes a retention portion in which the resin is retained and spread out in a lateral direction; however, this may cause destabilization of film formation and requires more complicated control of production conditions as the conveying speed of the film increases.

Furthermore, the conventional process has a critical problem that a structure layer having a structure such as that of a lens is formed on the entire surface of a film even on a part of the film which normally requires no structure. Forming the structure layer on the entire surface of the film increases the design constraints, and also increases risks such as breaking or cracking due to the structure layer when performing punching or cutting.

The present invention has been made in light of such circumstances and has an object to provide a method and an apparatus, suitable for production of a relief-pattern forming having a fine relief pattern on the surface thereof, with higher quality and higher productivity, and fewer defects.

Solution to Problem

An aspect of the present invention that solves the above problem is a method for producing a relief-pattern forming, characterized in that the method includes: printing a transfer pattern onto a surface of a first substrate on which a relief-structure pattern is formed at a predetermined position using a printing ink containing an ionizing radiation-curable resin by registration with the relief-structure pattern; drying the printed transfer pattern; after the drying, laminating a second substrate on the surface of the first substrate on which the transfer pattern has been printed; after the lamination, curing the printed transfer pattern by irradiating ionizing radiation; and after the curing, performing peeling at the interface between the transfer pattern and the surface of the first substrate on which the relief-structure pattern is formed to form the transfer pattern having an inverted structure of the relief-structure pattern on the second substrate.

Further, an aspect of the present invention is an apparatus for producing a relief-pattern forming, characterized in that the apparatus includes: a feeder that feeds a first substrate taken up in a roll shape and having a relief-structure pattern on one surface thereof; a printer section that prints a transfer pattern onto a surface of the first substrate on which the relief-structure pattern is formed by registration with the relief-structure pattern to provide a transfer pattern printed layer; a dryer section that removes solvent components of the transfer pattern printed layer with hot air; a laminator section that pinches the surface of the first substrate on which the transfer pattern printed layer is provided and a second substrate, between two rolls, to bond them; a curing section that irradiates the transfer pattern printed layer with ionizing radiation in the state where the first substrate and the second substrate are bonded to each other; a separating section that peels off the second substrate from the first substrate while pinching them, between two rolls; and winding devices that take up the first substrate and the second substrate after being separated from each other, respectively.

Further, an aspect of the present invention is a seal formed by stamping the second substrate having the transfer pattern so as to include the transfer pattern.

Advantageous Effects of Invention

According to an aspect of the present invention, a relief-pattern forming can be formed in a transfer pattern having an inverted structure of a relief-structure pattern onto a second substrate with higher quality and higher productivity, and fewer defects.

DESCRIPTION OF THE REPRESENTATIVE EMBODIMENTS

Embodiments of the present invention will be described below with reference to the drawings. It is understood that the present invention is not necessarily limited to these embodiments and that these embodiments are representative of the present invention.

The drawings are schematic, and the relation between the thickness and the plane dimension and the ratios of the layer thicknesses differ from actual ones.

The following embodiments exemplify configurations embodying the technical concept of the present invention. The technical concept of the present invention should not be construed as limiting materials, shapes and structures of constituent parts to those set out hereinafter. The technical concept of the present invention may be altered in various ways within the technical scope defined in the claims set forth later.

Figure 1:
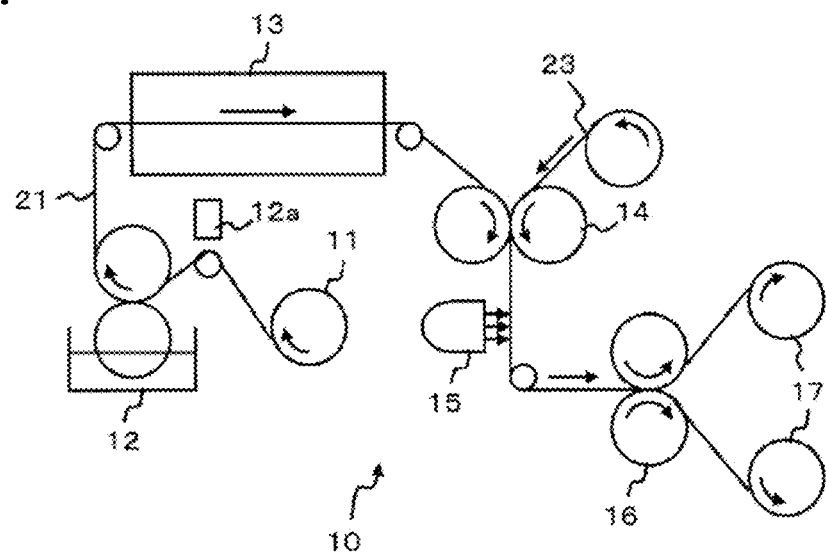
FIG. 1 is a schematic view of a configuration of an apparatus for producing a relief-pattern forming related to an embodiment of the present invention.

As shown in FIG. 1, a relief-pattern forming producing apparatus 10 of the present embodiment includes a feeder 11, a printer section 12, a dryer section 13, a laminator section 14, a curing section 15, a separating section 16, and winder 17.

In the apparatus configuration of the present embodiment, a description will be given of the case where each step is carried out continuously while being conveyed by rolls in accordance with the roll-to roll production method. However, the production method for the present invention is not limited thereto, and also includes production by a single wafer process.

The feeder 11 is a device that feeds out a first substrate 21 taken up in a roll shape with respect to a feeding shaft. On one surface of the first substrate 21, a predetermined relief-structure pattern is provided. The first substrate 21 is composed of, for example, a belt-shaped film.

The printer section 12 is a device that prints ionizing radiation-curable resin liquid on the surface of the first substrate 21 that is continuously conveyed, on which a relief-structure pattern is formed. The printer section 12 includes a liquid supply source for supplying ionizing radiation-curable resin liquid, a liquid supply device (a liquid feeding pump device), a printing unit and the like. That is, the printing ink for forming a transfer pattern contains the ionizing radiation-curable resin.

As the printing method of the printer, a method capable of pattern printable method can be used. The method includes gravure printing, screen printing, flexographic printing, ink-jet printing or the like. The thickness of the film after drying of a printed portion by the printer section 12 varies depending on the printing method; however, it is in the range of 0.5 µm or more and 50 µm or less, preferably 2 µm or more and 20 µm or less.

The printer section 12 includes a mark sensor 12a for printing a transfer pattern by registration with the relief-structure pattern of the first substrate 21, and a position control mechanism (not shown) for the first substrate 21. In order to perform registration, in the production method of the present embodiment, a registration mark that can be read by the mask sensor 12a is also provided on the first substrate 21. The registration mark may be a relief-structure pattern itself or may be separately provided on the first substrate by other printing as long as it can be read by the mark sensor 12a. As the position control mechanism of the first substrate 21, a position control mechanism used for an additional printing of a general gravure printing can be adopted.

Figure 3:
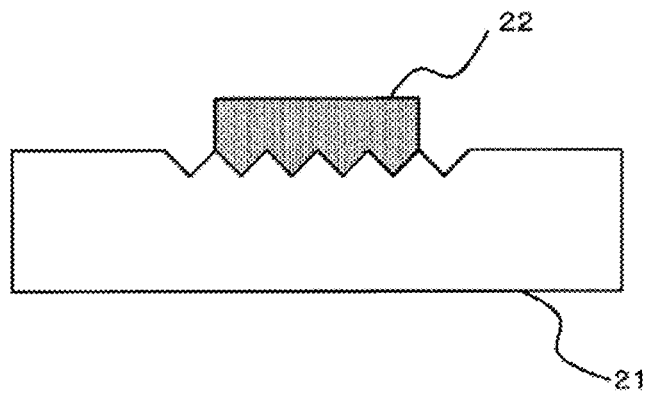
FIG. 3 is a schematic cross-sectional view which illustrates a transfer pattern printed onto a relief-structure pattern of a first substrate.

As shown in FIG. 3, through the printer section 12, a transfer pattern printed layer 22 is formed on the relief-structure pattern of the first substrate 21.

The dryer section 13 is a device that continuously dries the coating liquid printed on the first substrate 21 that is continuously conveyed. The dryer section 13 is not limited as long as it can generally uniformly dry the coating liquid of the transfer pattern printed layer 22 printed on the first substrate 21, as in the tunnel-like drying device shown in FIG. 1, for example, various known drying devices can be used. For example, a radiant heating type with a heater, a hot air circulating type, a far infrared type, or the like can be used.

The laminator section 14 is a device that pinches a printed surface on which the transfer pattern of the first substrate 21 is continuously conveyed, and a film-like second substrate 23, between two rolls, to bond them. A roll used for pinching them includes a laminating roll made of metal, resin, rubber or the like. Since the conditions of the circumferential surface of the laminating roll affects the surface properties and adhesiveness of two substrates bonded to each other, it is preferred that the laminating roll has high circularity and high smoothness of the surface.

Figure 4:
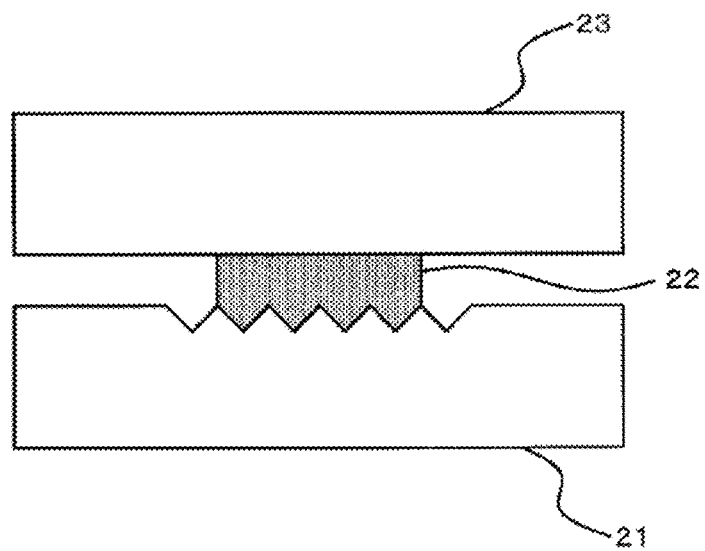
FIG. 4 is a schematic cross-sectional view which illustrates a situation when a laminator has been used.

As shown in FIG. 4, through the laminator section 14, the second substrate 23 is adhered to the transfer pattern printed layer 22 on the relief-structure pattern of the first substrate 21. Since the surface of the transfer pattern printed layer 22 including the transfer pattern printed on the relief-structure pattern has low smoothness, the surface is heated to improve the fluidity thereof in the laminating process, and thus the adhesiveness between the transfer pattern printed layer 22 and the second substrate 23 can be improved. However, excessive increase of the fluidity of the transfer pattern printed layer 22 causes the collapse of the pattern shape. Accordingly, the heating temperature is generally set to be in the range of 60° C. or more and 150° C. or less; however it is preferable to suitably set the heating temperature in accordance with the properties of the materials. Heating in the laminating process can be carried out by heating the laminating roll itself, or by directly heating the bonded portion with a heater or the like.

The transfer pattern printed layer 22 serving as a product may be discontinuously formed on the first substrate 21, which may result in wrinkles due to misalignment between the substrates to be bonded in the laminating process. In order to prevent this problem, a second transfer pattern printed layer can be provided outside the product area, such as in the vicinity of both end of the first substrate 21 the second transfer pattern printed layer can be in a line shape, continuously provided in the conveying direction.

The curing section 15 is a device that irradiates ionizing radiation to the transfer pattern printed layer 22 laminated and sandwiched between the first substrate 21 and the second substrate 23. Irradiating ionizing radiation cures the ionizing radiation-curable resin contained in the transfer pattern printed layer 22. The curing section 15 is composed of, for example, an ultraviolet lamp.

The curing section 15 needs to conform to the requirements for curing the ionizing radiation-curable resin used for the transfer pattern printed layer 22. In addition, since ionizing radiation has an influence such as on brittleness of the substrate, a surface to be irradiated is selected as necessary. That is, when it is desired to reduce the influence on the second substrate 23 serving as a product, irradiation is performed from the first substrate 21 side. Further, when it is desired to prolong the life of the first substrate 21 which is to be repeatedly used, irradiation is preferably performed from the second substrate 23 side.

Figure 2:
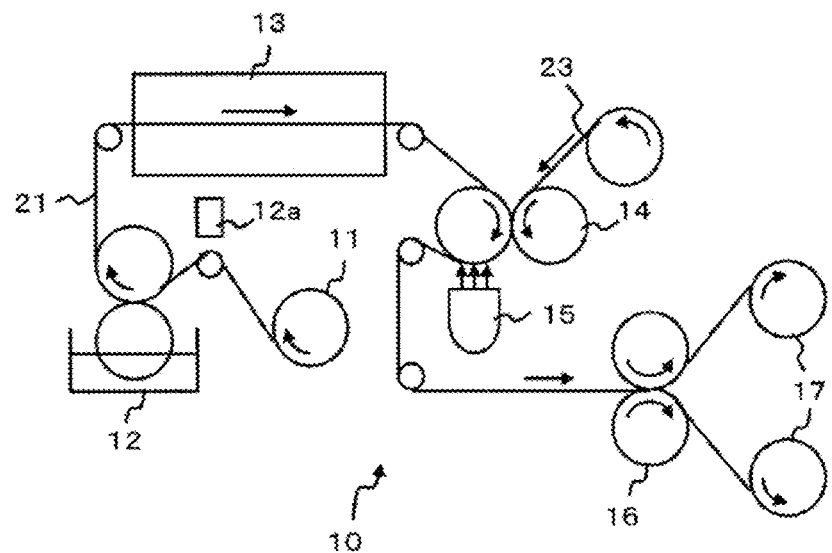
FIG. 2 is a schematic view of another configuration of an apparatus for producing a relief-pattern forming related to an embodiment of the present invention.

As shown in FIG. 2, the curing section 15 can be provided in the state that the irradiation direction is towards the laminating roll when there is a concern that the transfer pattern printed layer 22 may be peeled off from the second substrate 23 due to low adhesion therebetween, or low cohesive force of the transfer pattern printed layer 22 before curing and the like.

The separator section 16 is a device that separates the first substrate 21 and the second substrate 23 that are bonded to each other. The separator section 16 pinches the first substrate 21 and the second substrate 23 that are bonded to each other between a pair of rolls, and the first substrate 21 and the second substrate 23 are taken up by the winding devices 17 after they pass through the pair of rolls. Thus, the first substrate 21 is peeled off from the second substrate 23. In order to perform stable peeling, one of a pair of rolls constituting the separator section 16 is preferably provided with a driving means.

Figure 5:
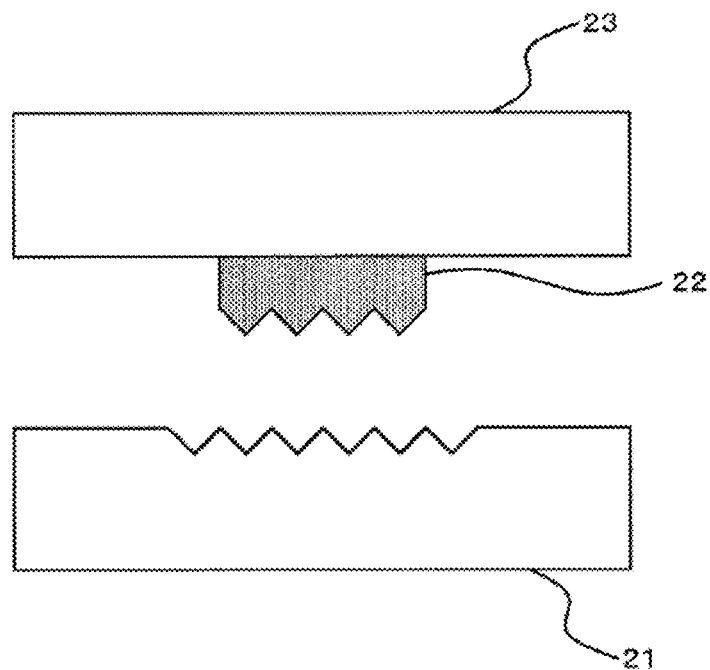
FIG. 5 is a schematic cross-sectional view which illustrates a situation when separation has been performed.

In the present embodiment, as shown in FIG. 5, the peeling is performed at the interface between the surface of the relief-structure pattern of the first substrate 21 and the transfer pattern printed layer 22. With respect to a region where the transfer pattern printed layer 22 is not provided, the introduced first substrate 21 and the second substrate 23 are separated without having the transfer pattern printed layer 22. Through these series of steps, the transfer pattern printed layer 22 is transferred onto the second substrate 23 serving as a product to form a transfer pattern.

When the heat of heating during lamination, or the heat of irradiation with ionizing radiation accumulates and the temperature of the rolls constituting the separator section rises, one of the rolls or each of the rolls may preferably provided with a cooling means. The cooling means includes a method for circulating a coolant such as cooling water inside the rolls, a method for air-cooling from the outside of the rolls, and the like.

When, the adhesion between the transfer pattern printed layer 22 and the second substrate 23 is developed at a relatively high temperature, the heating means can heat the transfer pattern printed layer 22 during peeling, to reduce a peeling resistance between the surface of the relief-structure pattern of the first substrate 21 and the transfer pattern printed layer 22. The heating means includes a method for circulating warm water or thermal medium oil to the inside of the roll, a method which uses an induction heating roll, a method which provides a heater to the outside of the roll, and the like. The temperature of the heating at the separator section 16 is generally set to about 60° C. to 150° C.; however, it is preferable to suitably set the temperature in accordance with the properties of the material.

Although not shown in FIG. 1, the second substrate 23 can be irradiated with ionizing radiation again after being peeled off to further accelerate the curing.

The winding devices 17 are devices that take up the first substrate 21 and the second substrate 23, which are peeled off from each other, in a roll shape, and are constituted by a winding shaft or the like for winding the respective substrates. In the production method of the present embodiment, since the thickness of the transfer pattern printed layer 22, which is partially provided, is about 50 μm at the maximum, an edge tape can be applied to the substrates as necessary when winding the substrates.

The producing apparatus 10 for producing the relief-pattern forming may be provided with a guide roll or the like to form a path for conveying the substrate between each section, and may be provided with a tension roll or the like as necessary to improve the conveyance stability of the substrates.

Next, materials applied to the present invention will be described.

As the first substrate 21, the substrate having a surface to be printed on which the preset fine relief-structure pattern is formed is used. This fine relief-structure pattern needs to have an inverted shape of a fine relief pattern of a surface of a relief-pattern forming serving as a product. The first substrate 21 may be composed of a single layer or a plurality of layers.

The relief-pattern forming serving as a product obtained by transferring the relief-structure pattern to the second substrate 23 with the transfer pattern therebetween includes a structure of, for example, a lenticular lens, a prism lens, a microlens array, or a Fresnel lens in which fine relief patterns are arranged, a diffraction grating having a finer structure or a nonreflective structure. The relief-structure pattern of the first substrate 21 is formed in an inverted shape of the relief pattern.

The depth of the structure of the relief-structure pattern may be, for example, in the range of 0.01 µm or more and 50 µm or less; however it is not limited thereto. However, when the thickness of the transfer pattern printed layer 22 provided by the printer section 12 is insufficient with respect to the depth of the structure, air will remain between the transfer pattern printed layer 22 and the second substrate 23 during lamination, resulting in transfer failure because the ionizing radiation-curable resin is prevented from being cured. Accordingly, the structure of the relief-structure pattern and the thickness of the transfer pattern printed layer 22 need to suitably be set. For this reason, the depth of the structure is more preferably set to about 0.1 µm to 10 µm.

The pitch of the structure of the relief-structure pattern may be in the range of 0.01 µm or more and 100 µm or less; however, it is not limited thereto. The term "pitch" refers to the intervals between the structures constituted by repetition of a single structure such as that of a lenticular lens, a prism lens, a microlens array, and a finer structure. In a structure such as a Fresnel lens constituted by a plurality of grooves, the pitch refers to the intervals between the grooves. The transfer suitability during lamination is affected by the aspect ratio (the value obtained by dividing the depth by the pitch) of the structure of the relief-structure pattern. As the aspect ratio increases, the transfer suitability decreases. Therefore, the aspect ratio of the structure of the relief-structure pattern is preferably 1 or less, and more preferably 0.5 or less.

As a method for forming the relief-structure pattern on the first substrate 21, a known method such as a lens molding method, or an embossing method can be used. In the present embodiment, the method for transferring the relief-structure pattern from the first substrate 21 is advantageous over a conventional method in the following points.

Firstly, in the present embodiment, the relief structure can be partially provided to the substrate, and thus the transfer pattern printed layer 22 can be provided only at the portion required in terms of functions. Accordingly, the range of designing the product is enhanced, and materials can be reduced. The conventional method has the problem that the end portion of the product may be cracked or chipped due to the relief-patterned layer; however, the structure of the present embodiment can avoid this problem.

Secondly, the conventional method has low productivity; however, a substrate can be repeatedly used as the first substrate 21 in the present embodiment. Accordingly, improvement in the productivity can be expected. Furthermore, the conventional method has limitations of the material that can be used as a substrate or a structure forming layer; however, the variety of selectable material can be increased in the present embodiment compared with the conventional one.

The material for the first substrate 21 can include various resins. Examples thereof can include a known material such as polyethylene, polypropylene, polyvinyl chloride, polyvinylidene chloride, polyvinyl acetate, polyester, polyolefin, acrylic, polystyrene, polycarbonate, polyamide, PET (polyethylene terephthalate), biaxially stretched polyethylene terephthalate, polyethylene naphthalate, polyamide imide, polyimide, aromatic polyamide, cellulose acylate, cellulose triacetate, cellulose acetate propionate, and cellulose diacetate.

The configuration of the first substrate 21 is not limited to a single-layered configuration, and may be a configuration made of two or more layers. However, when curing by ionizing radiation is performed from the first substrate 21 side, it is necessary to use a material that transmits ionizing radiation for the irradiation.

Further, when the structure of the first substrate 21 is composed by a plurality of layers, a material having releasability can be used for the layer having the relief-structure pattern. Accordingly, the peeling resistance of the transfer pattern printed layer 22 can be decreased in the separating unit 16, and transfer failure can be reduced. The material having releasability is preferably a fluorine-based release material, since it is expected that it is not easily transferred to the transfer pattern printed layer 22, and has high reproducibility.

The first substrate 21 generally has a width of 0.1 m or more and 1.5 m or less, a length of 100 m or more and 100000 m or less, and a thickness of 12 µm or more and 250 µm or less; however, it is not limited thereto.

The ionizing radiation-curable resin liquid used in the present embodiment is preferred to contain a thermoplastic resin composition in the state that it is not irradiated with the ionizing radiation and is not cured. Further, the ionizing radiation-curable resin after the volatile components of the coating solution removed by the dryer section 13 is preferably a solid at room temperature or high viscosity liquid having little fluidity. This is for preventing the collapse of the shape of the pattern printing during lamination in a subsequent step.

The ionizing radiation-curable resin which can be used in the present embodiment may contain a reactive group-containing compound such as a (meth) acryloyl group, a vinyl group or an epoxy group, and a compound which generates an active species such as a radical or a cation that is able to react with the reactive group-containing compound by irradiation with ionizing radiation such as ultraviolet light.

In particular, from the viewpoint of curing speed, a combination of a reactive group-containing (monomer) containing an unsaturated group such as a (meth) acryloyl group and a vinyl group, and an optical radical polymerization initiator that generates radicals by light is preferable. Of these, a (meth) acryloyl group-containing compound such as a (meth) acrylate, a urethane (meth) acrylate, an epoxy (meth) acrylate and a polyester (meth) acrylate is preferable.

As the (meth) acrylyl group-containing compound, a compound containing one or two (meth) acryloyl groups can be used. The reactive group-containing compounds (monomer) containing unsaturated group such as the acryloyl group and the vinyl group may be used alone or in combination of a plurality thereof as necessary.

As the optical radical polymerization initiator, various commercially available products can be used. The content of the optical radical polymerization initiator is preferably 0.01 mass % or more and 10 mass % or less, and more preferably 0.5 mass % or more and 7 mass % or less in all compositions. The upper limit of the content of the optical radical polymerization initiator is preferably within this range from the viewpoint of the curing properties of the compositions, and the dynamic properties and the optical properties of the cured product. Further, the lower limit of the content of the optical radical polymerization initiator is preferably within this range from the viewpoint of preventing the decrease of the curing speed.

The ionizing radiation-curable resin liquid of the present embodiment can contain various additives such as an antioxidant, an ultraviolet absorber, a light stabilizer, a silane coupling agent, a coating surface improver, a thermal polymerization inhibitor, a leveling agent, a surfactant, a colorant, a storage stabilizer, a plasticizer, a lubricant, a solvent, a filler, an antioxidant, a wettability improving agent, and a releasing agent as necessary.

An organic solvent for adjusting the viscosity of the resin liquid of the present embodiment can include any organic solvent which can be mixed without causing unevenness such as precipitation, phase separation, or white turbidity when being mixed with the resin liquid. Examples of the organic solvent include acetone, methyl ethyl ketone, methyl isobutyl ketone, ethanol, propanol, butanol, 2-methoxyethanol, cyclohexanol, cyclohexane, cyclohexanone, toluene and the like. These may be used in combination of a plurality thereof as necessary.

The transfer pattern printed layer 22 is formed on one surface of the second substrate 23 by a series of steps of the laminator section 14, the curing section 15, and the separating section 16. Therefore, the side of the surface where the transfer pattern printed layer 22 is formed is required to have sufficient adhesion with the transfer pattern printed layer 22.

In addition, the second substrate 23 is a substrate used as a product and needs to satisfy properties required as a product. However, in general, the same material as the first substrate 21 can be used. When curing by ionizing radiation is performed from the second substrate 23 side; however, it is necessary for the second substrate 23 to be composed of a material that transmits the ionizing radiation which is irradiated.

The configuration of the second substrate 23 is not limited to a single-layered configuration, and may be a structure made of two or more layers. Further, the structure includes a structure having an underlayer such as an adhesive layer or a tacky layer which is dried and cured, and a structure in which the other functional layer is provided on the back surface in advance. Providing the underlayer such as the adhesive layer or the tacky layer on the surface of the second substrate 23 on which the transfer pattern printed layer 22 is formed improves the adhesion between the second substrate 23 and the transfer pattern printed layer 22. Accordingly, the improvement of the quality of transferring can be expected. The adhesive layer can include, for example, a thermoplastic resin such as a polyester resin, an acrylic resin, a vinyl chloride resin, a vinyl resin, a polyamide resin, a polyvinyl acetate resin, a rubber resin, an ethylene-vinyl acetate copolymer resin, and a vinyl chloride-vinyl acetate-vinyl alcohol copolymer.

Further, the second substrate 23 may be subjected to corona discharge, plasma treatment, easy adhesion treatment, heat treatment, dust removal treatment or the like as another treatment in advance.

Similarly to the first substrate 21, the second substrate 23 generally has a width of 0.1 m or more and 1.5 m or less, a length of 100 m or more and 100000 m or less, and a thickness of 12 μm or more and 250 μm or less; however, it is not limited thereto.

In the present embodiment, the following effects are obtained.

(1) In producing the relief-pattern forming of the present embodiment, the transfer pattern printed layer 22 having an inverted structure of the relief-structure pattern is formed on the second substrate 23 by conducting the following sequential steps. The steps include: printing a transfer pattern onto a surface of the first substrate 21 on which a relief-structure pattern is formed at a predetermined position by registration with the relief-structure pattern; drying the transfer pattern printed layer 22; laminating the second substrate 23 onto the surface of the first substrate 21 on which the transfer pattern has been printed; curing the transfer pattern printed layer 22 by irradiating ionizing radiation; and performing peeling at the interface between the transfer pattern printed layer 22 and the surface of the first substrate 21 on which the relief-structure pattern is formed.

According to this configuration, the relief-pattern forming with the transfer pattern printed layer 22 having the inverted structure of the relief-structure pattern on the second substrate 23 can be produced with higher quality and higher productivity, and fewer or even no defects.

(2) The lamination is carried out while heating.

Performing the lamination while heating further increases the adhesion between the printed pattern and the second substrate 23.

(3) The peeling is performed while heating.

Performing peeling while heating improves releasability between the printed pattern and the relief-structure pattern of the first substrate 21, and thus a relief-pattern forming of higher quality with fewer pattern defects can be produced.

(4) The first substrate 21 is composed of a plurality of layers, and the layer having the relief-structure pattern of the first substrate 21 contains a fluorine-based release material.

Making the layer having the relief-structure pattern into a layer containing a fluorine-based release material improves releasability between the printed pattern and the relief-structure pattern of the first substrate 21, and thus a relief-pattern forming of high quality with fewer pattern defects can be produced.

(5) The second substrate 23 is composed of a plurality of layers, and the surface to be laminated with the transfer pattern printed layer 22 is made of an adhesive layer or a tacky layer.

Using an adhesive layer or a tacky layer allows production of a relief-pattern forming having higher adhesion between the printed pattern and the second substrate 23.

(6) Ionizing radiation is irradiated from the first base 21 side.

Irradiating ionizing radiation from the first substrate 21 side allows production of a relief-pattern forming in which the second substrate 23 is less influenced by irradiation with ionizing radiation. Even if the second substrate 23 is composed of a material which does not transmit ionizing radiation, the transfer pattern printed layer 22 can be cured by ionizing radiation.

(7) Both the first substrate 21 and the second substrate 23 are supplied from rolls and taken up.

Supplying and taking up both the first substrate 21 and the second substrate 23 using rolls provides a method for producing a relief-pattern forming having higher productivity.

Next, with reference to FIGS. 6 and 7, a seal of the present embodiment will be described.

Figure 6:
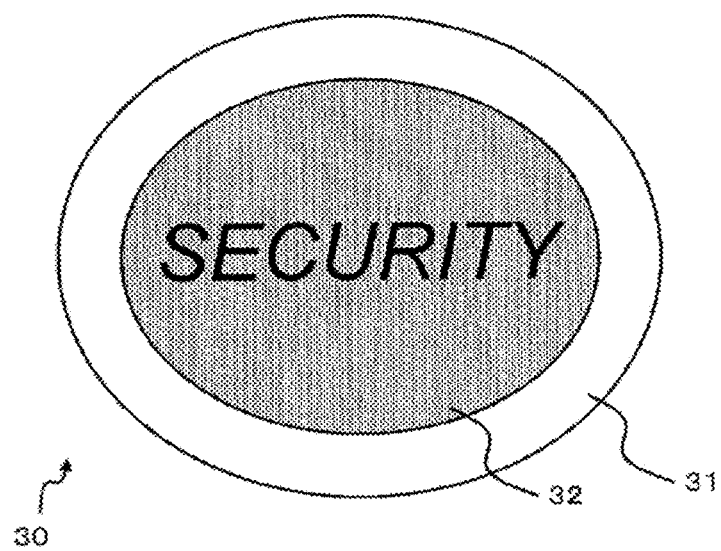
FIG. 6 is a schematic view of a configuration of a seal related to an embodiment of the present invention.

As shown in FIG. 6, a seal 30 of the present embodiment is defined by 2 regions which are an inclusion portion 32 having the transfer pattern printed layer 22 and a peripheral edge portion 31 positioned at the outer periphery of the transfer pattern printed layer 22 in a plan view, that is, when viewed from the front surface. As shown in FIG. 7, the seal 30 has a layer configuration made of at least the second substrate 23, the transfer pattern printed layer 22, and an adhesive material 24. As shown in FIG. 7, the seal 30 is held on a separator 25 before being attached to the object to be adhered.

In addition to this layer configuration, the seal 30 of the present embodiment may separately be provided with a transparent reflective layer or an opaque reflective layer for enhancing the optical effects of the relief structure of the transfer pattern printed layer 22, or an anchor layer for improving adhesion between the layers. A modified example of the seal 30 will be described later.

In the seal of the present embodiment, the peripheral portion 31 does not include the transfer pattern printed layer 22, and the second substrate 23 is directly adhered to the object to be bonded with the adhesive material therebetween after being attached to the object to be adhered.

Since a material having high adhesion, as described above, is used for the second substrate 23, the effect that the peripheral edge portion 31 can have high adhesion when the seal 30 is attached is obtained. In other words, in order to improve the formability and peelability of the transfer pattern, the transfer pattern printed layer 22 is often made of a material having good releasability in general. Therefore, it is difficult to increase the adhesion of the interface between, in particular, the transfer pattern printed layer 22 and the adhesive material, and thus the adhesion of the interface therebetween decreases after the seal 30 is attached to the transfer receiving object. However, in the present embodiment, the peripheral edge portion 31 of the seal 30 is configured to have high adhesion, so that the durability after being attached can be improved.

Here, the distance between the transfer pattern printed layer 22 and the outer peripheral portion, that is, the width (width outside the transfer pattern printed layer 22 in plan view) of the peripheral portion 31 is preferably 0.5 mm or more, more preferably 1 mm or more.

The adhesive material 24 is a material for attaching the seal 30 to the object to be bonded, and is made of a general adhesive which does not degenerate or attack the second substrate 23, the transfer pattern printed layer 22, or the object to be bonded. Specifically, the adhesive material 24 can include, for example, a vinyl chloride-vinyl acetate copolymer, a polyester type polyamide, an acrylic type, a butyl rubber type, a natural rubber type, a silicon type, a polyisobutyl type adhesive material and the like. Further, a polymerization initiator, a plasticizer, a curing agent, a curing accelerator, an antioxidant and the like can be added to these adhesive materials as necessary. For the formation of the adhesive material 24, a known printing method such as gravure printing, offset printing, screen printing, or a coating method such as bar coating, gravure coating, roll coating, die coating, or lip coating can be used.

Next, a modified example of the seal 30 will be described. In the drawings of the modified example described below, the separator 25 has been peeled off.

Figure 7:
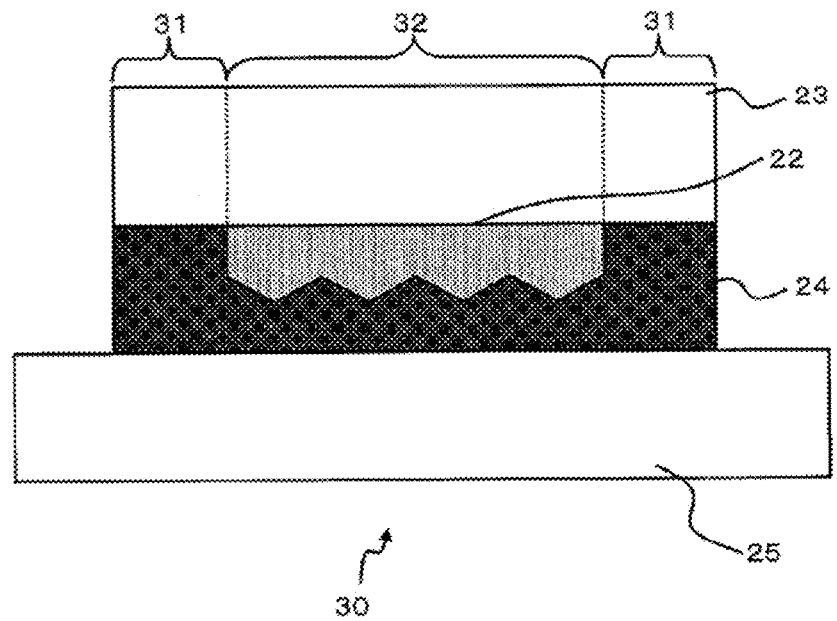
FIG. 7 is a cross-sectional view of a layer configuration of a seal related to an embodiment of the present invention.
Figure 8:
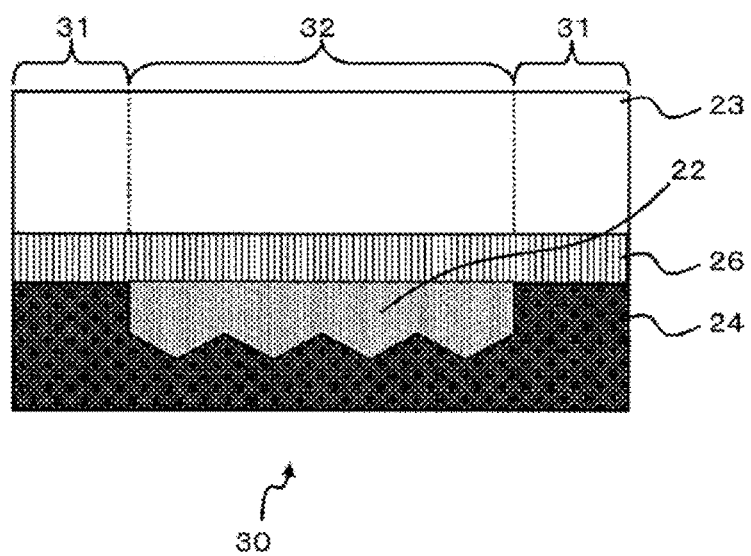
FIG. 8 is a cross-sectional view of a layer configuration of a seal according to a first modified example.

As shown in FIG. 8, the seal 30 of a first modified example is configured to be provided with an anchor layer 26 on the surface of the second substrate 23 on which the transfer pattern printed layer 22 is formed, in addition to the layer configuration (See FIG. 7).

The anchor layer 26 can be provided by applying a coating liquid composing the anchor layer 26 onto the surface of the second substrate 23 before laminating the second substrate 23.

Providing the anchor layer 26 in this manner can improve the adhesion between the second substrate 23 and the transfer pattern printed layer 22 and the adhesive material 24.

Such a seal 30 of the first modified example can be applied to, for example, a sticker-type seal to be attached to a product together with a substrate.

Figure 9:
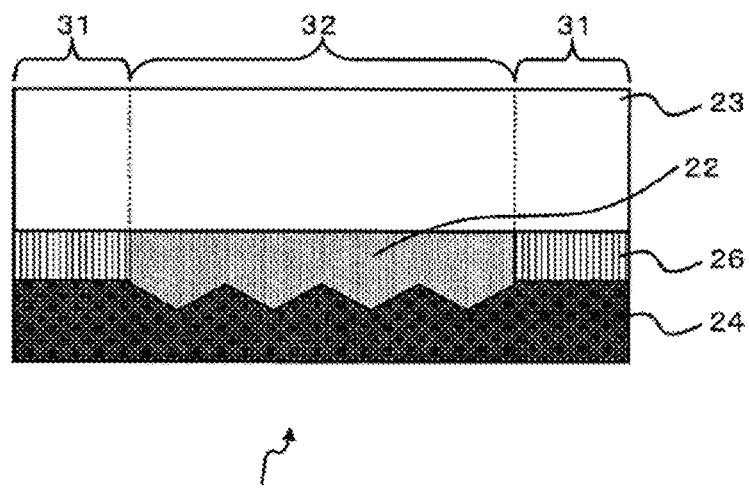
FIG. 9 is a cross-sectional view of a layer configuration of a seal according to a second modified example.

As shown in FIG. 9, the seal 30 of a second modified example is configured to be provided with the anchor layer 26 only in the region of the peripheral portion 31 on the surface of the second substrate 23 on which the transfer pattern printed layer 22 is formed, in addition to the layer configuration (See FIG. 7). That is, the seal 30 of the second modified example has a configuration in which the anchor layer 26 is arranged on the outer periphery of the transfer pattern printed layer 22.

The anchor layer 26 can be provided by printing the anchor layer 26 to a portion on which the transfer pattern is not printed by registration.

The seal 30 of the second modified example having such a layer configuration has high adhesion between the layers of the peripheral portion 31, and thus it is less likely to be peeled off unless it is intentionally peeled off. When the user tries to peel off the seal 30 on purpose, peeling (brittle fracture) occurs between the transfer pattern printed layer 22 and the second substrate 23 in the inclusion portion 32, so that it cannot be reused.

Such a seal 30 of the second modified example can be applied to, for example, a seal of a brittle sticker type. In the seal, it is expected that the transfer pattern printed layer 22 is peeled off from the second substrate 23 and remains at the object to be adhered when the user tries to, for example, attach the seal 30 together with the second substrate 23, and then tries to peel off the seal 30.

Figure 10:
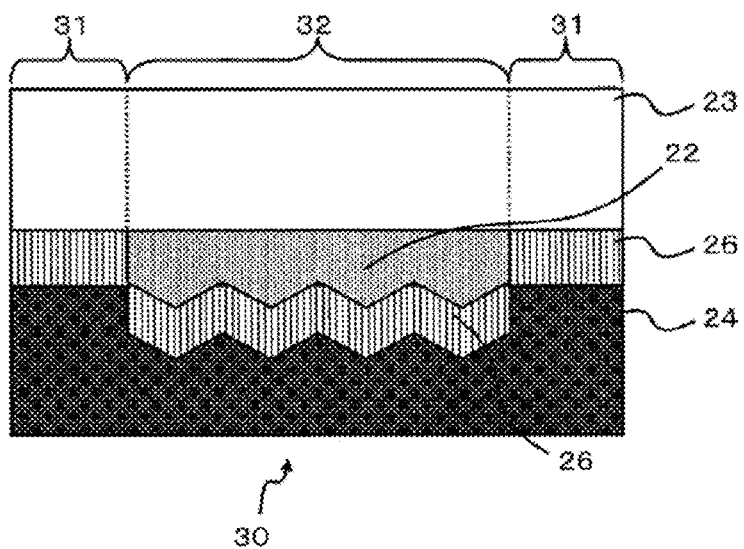
FIG. 10 is a cross-sectional view of a layer configuration of a seal according to a third modified example.

As shown in FIG. 10, in addition to the layer configuration of the seal 30 of the second modified example, the seal 30 of a third modification has a configuration in which the anchor layer 26 is also provided on the surface of the transfer pattern printed layer 22.

The anchor layer 26 can be provided by printing the anchor layer 26 onto the entire surface of the transfer pattern printed layer 22 from which the transfer pattern has been peeled off. In the seal 30 according to the third modified example having such a layer configuration, since the adhesion between the layers of the peripheral edge portion 31 is high, the seal 30 is less likely to be peeled off unless it is intentionally peeled off. When the user tries to peel off the seal 30 on purpose, peeling (brittle fracture) occurs between the transfer pattern printed layer 22 and the second substrate 23 in the inclusion portion 32, so that it cannot be reused. Further, the seal 30 of the third modified example has higher adhesion between the transfer pattern printed layer 22 and the adhesive 24 than that of the seal 30 of the second modified example.

Such a seal 30 of the third modified example can be applied to, for example, a brittle sticker type seal. In the seal, it is expected that the transfer pattern printed layer 22 is peeled off from the second substrate 23 and remains on the object to be adhered when the user tries to, for example, attach the seal 30 together with the second substrate 23, and then tries to peel off the seal 30.

Figure 11:
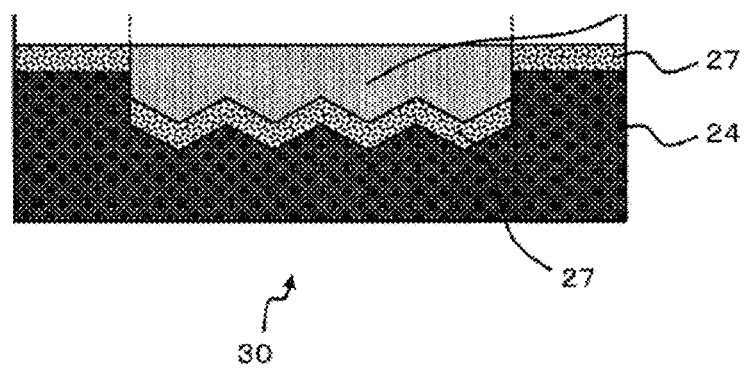
FIG. 11 is a cross-sectional view of a layer configuration of a seal according to a fourth modified example.

As shown in FIG. 11, the seal 30 of a fourth modified example has a configuration in which a reflective layer 27 is provided instead of the anchor layer 26 compared with the layer configuration of the seal 30 of the third modified example.

The reflective layer 27 may be provided on the entire surface in which the transfer pattern has been peeled off. The reflective layer 27 can be provided by vapor deposition of a metal thin film such as aluminum or evaporation of a high refractive index transparent thin film such as a metal oxide or metal sulfide.

The seal 30 of the fourth modified example having such a layer constitution can increase the visual effect of the irregular pattern by the reflective layer 27.

Such a seal 30 of the fourth modified example can be applied to, for example, the sticker type seal or the brittle sticker type seal described above.

Figure 12:
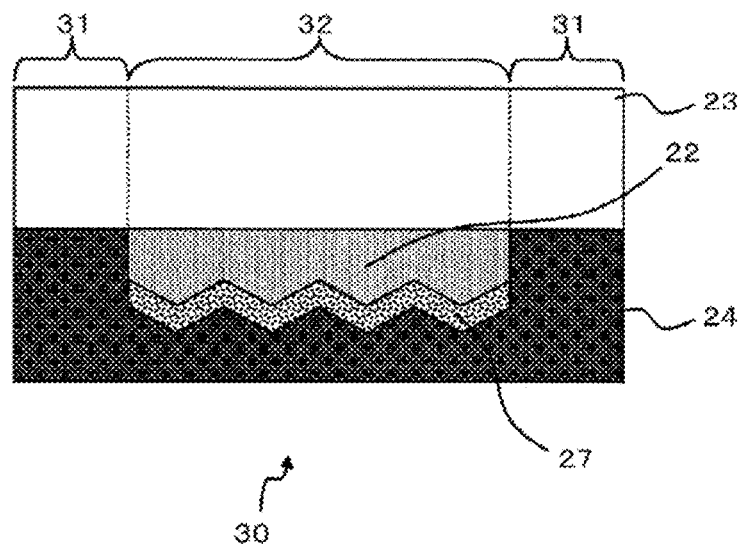
FIG. 12 is a cross-sectional view of a layer configuration of a seal according to a fifth modified example.

As shown in FIG. 12, the seal 30 of a fifth modified example has a configuration in which the reflective layer 27 is provided only on the surface of the transfer pattern printed layer 22 compared with the layer configuration of the seal 30 of the fourth modified example.

The reflective layer 27 may be provided on the transfer pattern printed layer 22 when the transfer pattern is peeled off. The reflective layer 27 can be provided by vapor deposition of a metal thin film such as aluminum or evaporation of a high refractive index transparent thin film such as a metal oxide or metal sulfide.

In the seal 30 of the fifth modified example having such a layer configuration, it is possible to increase the visual effect of the relief pattern by the reflective layer 27. Further, compared with the layer configuration of the seal 30 of the fourth modified example, the seal 30 of the fifth modified example is capable of giving a more distinctive visual effect because the reflective layer 27 is patterned.

Such a seal 30 of the fifth modified example can be applied to, for example, the sticker type seal or the brittle sticker type seal described above.

Figure 13:
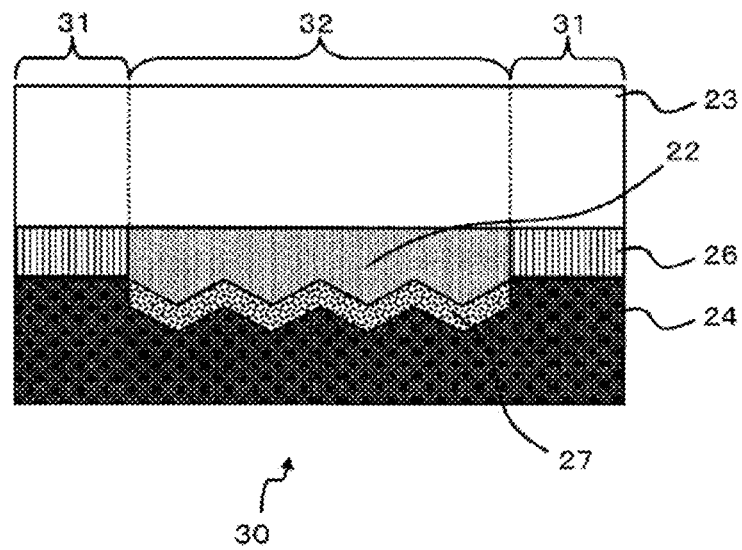
FIG. 13 is a cross-sectional view of a layer configuration of a seal according to a sixth modified example.

As shown in FIG. 13, the seal 30 of a sixth modified example has a configuration in which the anchor layer 26 is arranged only in the region of the peripheral edge portion 31, that is, at the outer periphery of the transfer pattern printed layer 22, compared with the layer configuration of the seal 30 of the fifth modified example.

The anchor layer 26 can be provided to the portion on which the transfer pattern is not printed by registration when printing the transfer pattern.

Further, the reflective layer 27 may be provided on the transfer pattern printed layer 22 when the transfer pattern is peeled off. The reflective layer 27 can be provided by vapor deposition of a metal thin film such as aluminum or evaporation of a high refractive index transparent thin film such as a metal oxide or metal sulfide.

In addition to the effect of the seal 30 of the fifth modified example, the seal 30 of the sixth modified example has high adhesion between the layers of the peripheral edge 31, so that it is difficult to be peeled off unless it is intentionally peeled off.

Such a seal 30 of the sixth modification can be applied to, for example, the brittle sticker type seal described above.

Figure 14:
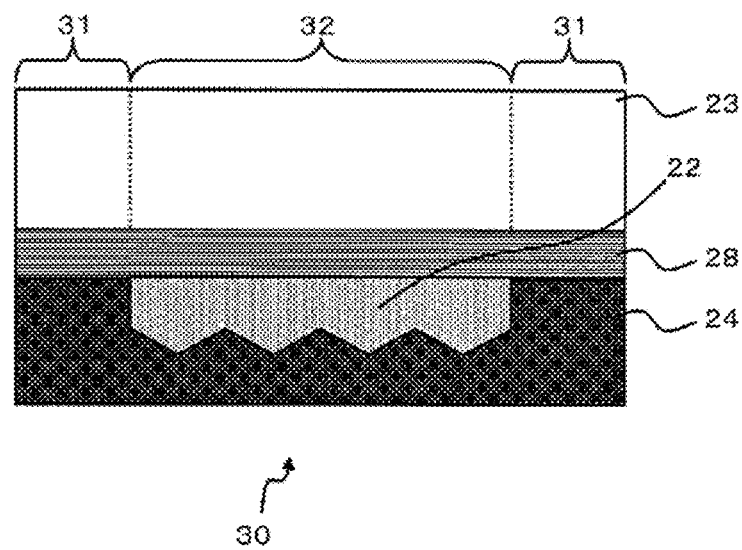
FIG. 14 is a cross-sectional view of a layer configuration of a seal according to a seventh modified example.

As shown in FIG. 14, in addition to the layer configuration shown in FIG. 7, the seal 30 of a seventh modified example has a configuration in which the peeling protective layer 28 is provided on the surface of the second substrate 23 on which the transfer pattern printed layer 22 is formed.

The peeling protective layer 28 can be provided by applying a coating liquid composing the peeling protective layer 28 on the surface of the second substrate 23 before laminating the second substrate 23.

Since the seal 30 of the seventh modification can be peeled off on the interface between the second substrate 23 and the peeling protective layer 28, it can be used for a transfer foil or a brittle sticker type seal.

Figure 15:
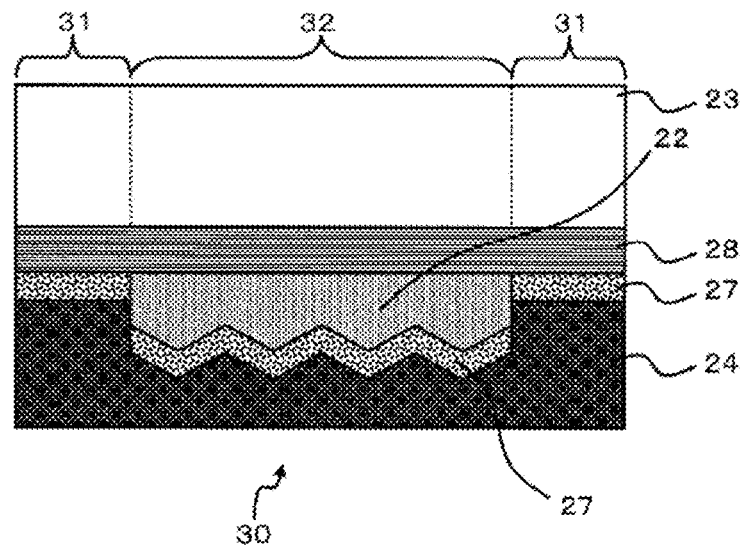
FIG. 15 is a cross-sectional view of a layer configuration of a seal according to an eighth modified example.

As shown in FIG. 15, the seal 30 of an eighth modified example has a configuration in which the peeling protective layer 28 is provided on the surface of the second substrate 23 on which the transfer pattern printed layer 22 is formed compared with the layer configuration of the seal 30 of the fourth modified example.

The peeling protective layer 28 can be provided by applying a coating liquid composing the peeling protective layer 28 on the surface of the second substrate 23 before laminating the second substrate 23.

The reflective layer 27 may be provided on the entire surface in which the transfer pattern has been peeled off. The reflective layer 27 can be provided by vapor deposition of a metal thin film such as aluminum or evaporation of a high refractive index transparent thin film such as a metal oxide or metal sulfide.

With this configuration, the seal 30 of the eighth modified example can increase the visual effect of the relief pattern by the reflective layer 27. Furthermore, since it can be peeled off at the interface between the second substrate 23 and the peeling protective layer 28, it can be used for a transfer foil or a brittle sticker type seal.

Figure 16:
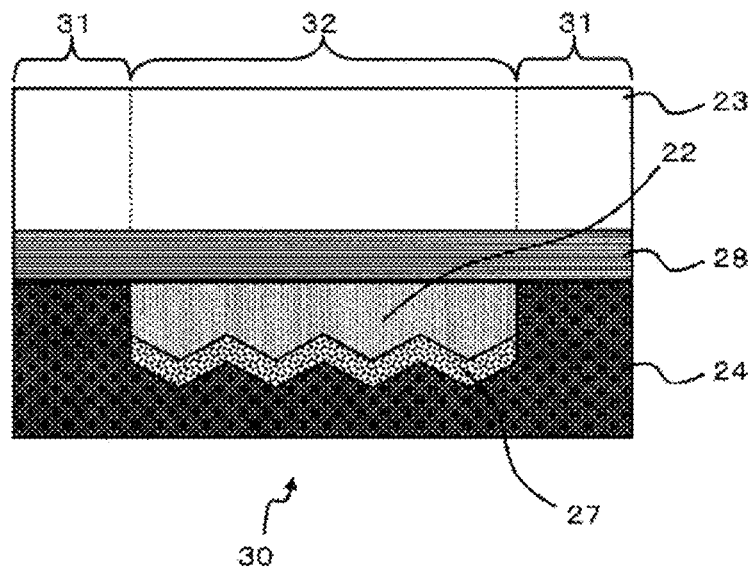
FIG. 16 is a cross-sectional view of a layer configuration of a seal according to a ninth modified example.

As shown in FIG. 16, the seal 30 of a ninth modified example has a configuration in which the peeling protective layer 28 is provided on the surface of the second substrate 23 on which the transfer pattern printed layer 22 is formed compared with the layer configuration of the seal 30 of the fifth modified example.

The peeling protective layer 28 can be provided by applying a coating liquid composing the peeling protective layer 28 on the surface of the second substrate 23 before laminating the second substrate 23.

The reflective layer 27 may be provided on the transfer pattern printed layer 22 when peeling off the transfer pattern. The reflective layer 27 can be provided by vapor deposition of a metal thin film such as aluminum or evaporation of a high refractive index transparent thin film such as a metal oxide or metal sulfide.

With this configuration, since the reflective layer 27 is patterned, it is possible to give a more distinctive visual effect to the seal 30 of the ninth modified example compared with the configuration of the seal 30 of the eighth modified example. Furthermore, since it can be peeled off at the interface between the second substrate 23 and the peeling protective layer 28, it can be used for a transfer foil or a brittle sticker type seal.

Further, using the transfer pattern printed layer 22 having better adhesion to the reflective layer 27 than to the second substrate 23, the effect that the reflective layer 27 is formed on the transfer pattern printed layer 22 side when the transfer pattern is peeled off is obtained.

The present application claims the benefit of priority to Japanese patent application No. 2015-098019 (filed on May 13, 2015), the entire contents of which are incorporated herein by reference.

Although the description has been made with reference to a limited number of embodiments, the scope of the invention is not limited thereto, and modifications of the above embodiments on the basis of the above disclosure are obvious to a person having ordinary skill in the art. That is, the present invention may not be limited to the aforementioned embodiments. Design modifications or the like can also be made to the above embodiments on the basis of knowledge of a skilled person in the art, and such modifications or the like are encompassed within the scope of the present invention.

10 . . . Relief-pattern forming producer; 11 . . . Feeder; 12 . . . Printer section; 12a . . . Mark sensor; 13 . . . Dryer section; 14 . . . Laminator section; 15 . . . Curing section; 16 . . . Separating section; 17 . . . Winder; 21 . . . First substrate; 22 ... Transfer pattern printed layer; 23 ... Second substrate; 30 ... Seal;

What is claimed is:

1. A method for producing a relief-pattern body, comprising:
    printing a transfer pattern onto a surface of a first substrate on which a relief-structure pattern is formed at a predetermined position using a printing ink containing an ionizing radiation-curable resin by registration with the relief-structure pattern;
    drying the printed transfer pattern;
    after the drying, laminating a second substrate onto the surface of the first substrate on which the transfer pattern has been printed;
    after the lamination, curing the printed transfer pattern by irradiating ionizing radiation; and
    after the curing, performing peeling at an interface between the transfer pattern and a surface of the first substrate on which the relief-structure pattern is formed to form the transfer pattern having an inverted structure of the relief-structure pattern on the second substrate.

2. The method for producing a relief-pattern body according to claim 1, wherein the lamination is thermal lamination.

3. The method for producing a relief-pattern body according to claim 1, wherein the peeling is performed while heating.

4. The method for producing a relief-pattern body according to claim 1, wherein the first substrate is composed of a plurality of layers, and a layer of the first substrate having the relief-structure pattern contains a fluorine-based release material.

5. The method for producing a relief-pattern body according to claim 1, wherein the second substrate is composed of a plurality of layers, and a layer of a surface to be laminated with the printed transfer pattern is an adhesive layer or a tacky layer.

6. The method for producing a relief-pattern body according to claim 1, wherein the irradiation of ionizing radiation is performed from a first substrate side.

7. The method for producing a relief-pattern body according to claim 1, wherein both the first substrate and the second substrate are subjected to curing while being conveyed between rolls.

8. The method for producing a relief-pattern body according to claim 1, wherein the peeling is performed while cooling.

9. The method of claim 7, wherein the transfer pattern is linear and is continuously printed in a direction in which the first substrate is transported during conveyance by the rolls.

10. The method of claim 1, wherein the peeling comprises separating the first substrate and the second substrate from each other using the rolls.

11. The method of claim 1, wherein the separation is performed while cooling the first substrate and the second substrate.

12. The method of claim 1, further comprising providing a registration mark on the first substrate.

* * * * *